US011164717B2

(12) United States Patent
Kikuchi et al.

(10) Patent No.: US 11,164,717 B2
(45) Date of Patent: Nov. 2, 2021

(54) ELECTRON MICROSCOPE

(71) Applicant: Hitachi High-Tech Corporation, Tokyo (JP)

(72) Inventors: Hideki Kikuchi, Tokyo (JP); Tadao Furutsu, Tokyo (JP); Kouichirou Saitou, Tokyo (JP); Hidekazu Suzuki, Tokyo (JP); Ryoji Namekawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/961,567

(22) PCT Filed: Mar. 23, 2018

(86) PCT No.: PCT/JP2018/011623
§ 371 (c)(1),
(2) Date: Jul. 10, 2020

(87) PCT Pub. No.: WO2019/180904
PCT Pub. Date: Sep. 26, 2019

(65) Prior Publication Data
US 2021/0066024 A1    Mar. 4, 2021

(51) Int. Cl.
*H01J 37/20* (2006.01)
*H01J 37/28* (2006.01)

(52) U.S. Cl.
CPC .............. *H01J 37/20* (2013.01); *H01J 37/28* (2013.01); *H01J 2237/2007* (2013.01);
(Continued)

(58) Field of Classification Search
None
See application file for complete search history.

(56) References Cited

U.S. PATENT DOCUMENTS 4,950,909 A * 8/1990 Yokoto ................ B23Q 1/5462
250/442.11
6,388,262 B1 * 5/2002 Alani ...................... H01J 37/20
250/442.11
(Continued)

FOREIGN PATENT DOCUMENTS

CN       107004555 A  *  8/2017  .............. H01J 37/22
CN       107004555 B  *  4/2019  .............. H01J 37/22
(Continued)

OTHER PUBLICATIONS

International Search Report (PCT/ISA/210) issued in PCT Application No. PCT/JP2018/011623 dated May 22, 2018 with English translation (five (5) pages).
(Continued)

*Primary Examiner* — Andrew Smyth
(74) *Attorney, Agent, or Firm* — Crowell & Moring LLP

(57) ABSTRACT

An object of the invention is to provide a technique of capturing images at higher speed and higher magnification when acquiring continuous tilted images with an electron microscope. The electron microscope of the invention includes a first spherical receiver fixed to a column of the electron microscope and configured to slide with a spherical fulcrum provided at a tip end of a sample holder; a spherical surface part provided on the column; and a second spherical receiver provided outside the column. The spherical surface part and the second spherical receiver slide on a contact part between the spherical surface part and the second spherical receiver, and a track of the slide is along a spherical surface centered on a central axis of the first spherical receiver, so that a view shift and a focus shift from an observation position of a sample can be reduced.

2 Claims, 6 Drawing Sheets

(52) U.S. Cl.
CPC .............. *H01J 2237/20207* (2013.01); *H01J 2237/20214* (2013.01); *H01J 2237/2802* (2013.01)

(56) References Cited

U.S. PATENT DOCUMENTS

| | | | | |
|---|---|---|---|---|
| 8,089,053 B1 * | 1/2012 | Finch | ................... | H01J 37/20 250/440.11 |
| 2017/0330724 A1 * | 11/2017 | Okumura | ............... | H01J 37/20 |

FOREIGN PATENT DOCUMENTS

| | | | | | |
|---|---|---|---|---|---|
| DE | 112015004746 | T5 * | 8/2017 | ............. | H01J 37/28 |
| JP | 8-106873 | A | 4/1996 | | |
| JP | 08106873 | A * | 4/1996 | | |
| JP | 2001-312989 | A | 11/2001 | | |
| JP | 2001312989 | A * | 11/2001 | | |
| JP | 2004-79313 | A | 3/2004 | | |
| JP | 2004079313 | A * | 3/2004 | | |
| JP | 2015-207482 | A | 11/2015 | | |
| JP | 2015207482 | A * | 11/2015 | | |
| JP | 2016-103387 | A | 6/2016 | | |
| JP | 2016103387 | A * | 6/2016 | ............. | H01J 37/28 |
| JP | 2016-173943 | A | 9/2016 | | |
| JP | 2016173943 | A * | 9/2016 | | |
| WO | WO-2016084872 | A1 * | 6/2016 | ............. | H01J 37/28 |

OTHER PUBLICATIONS

Japanese-language Written Opinion (PCT/ISA/237) issued in PCT Application No. PCT/JP2018/011623 dated May 22, 2018 (four (4) pages).

* cited by examiner

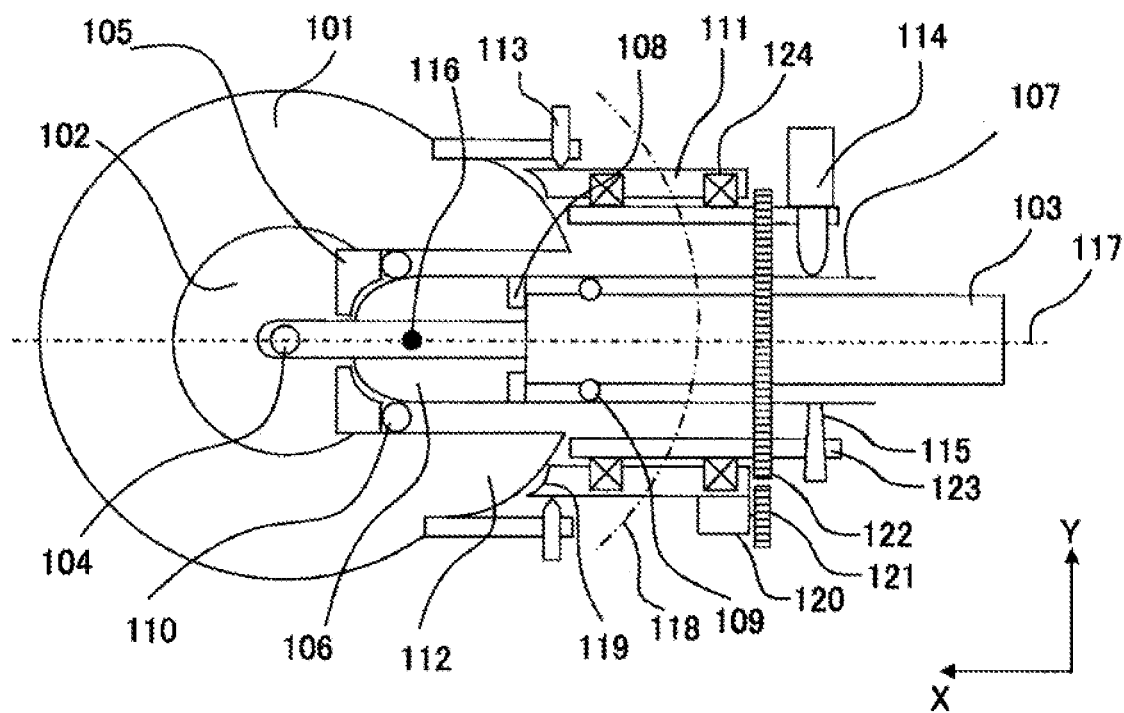
[FIG. 1]

[FIG. 2]
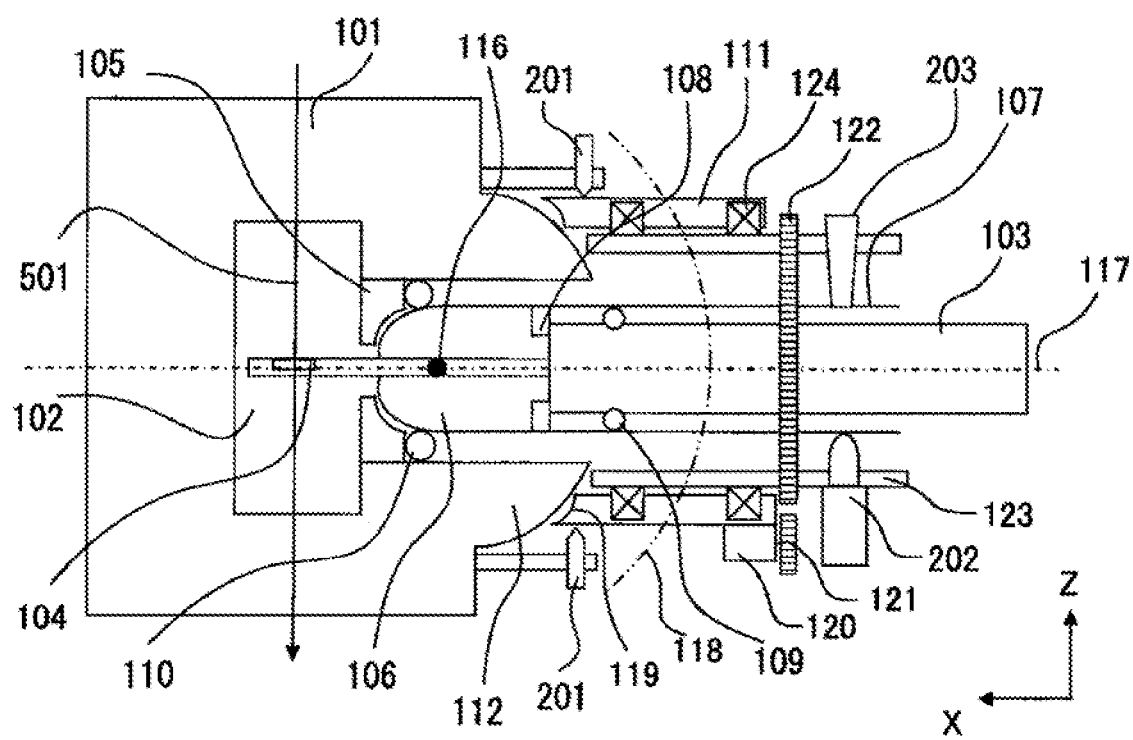

[FIG. 3]
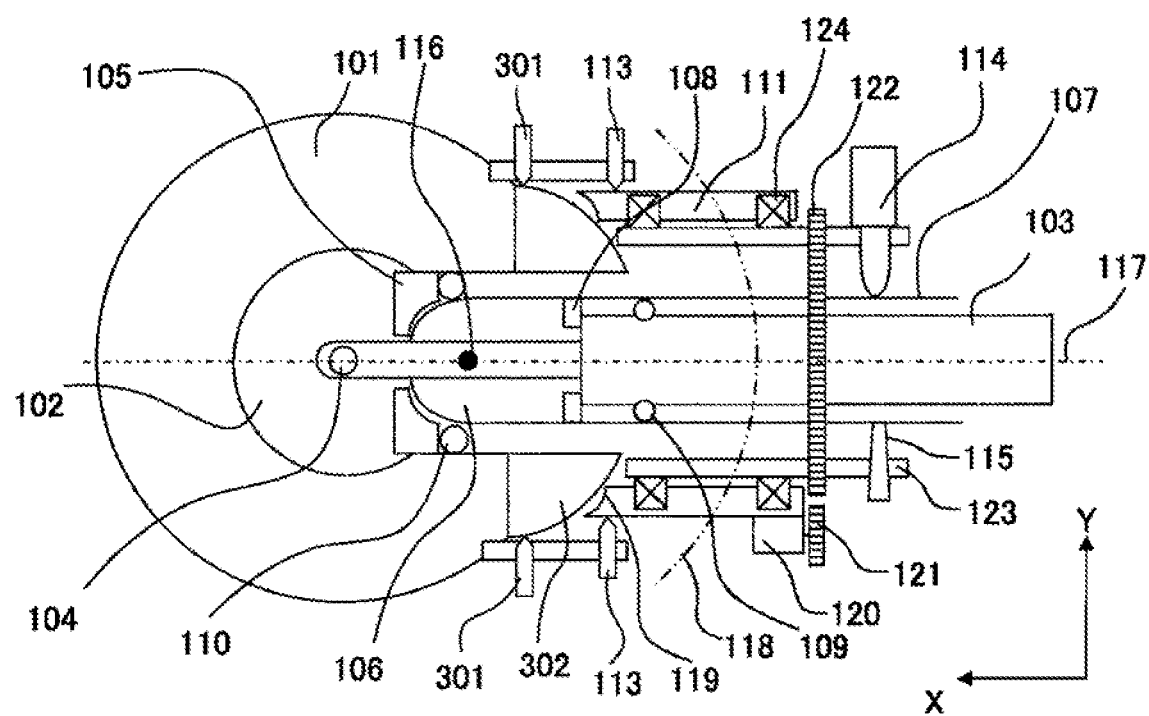

[FIG. 4]
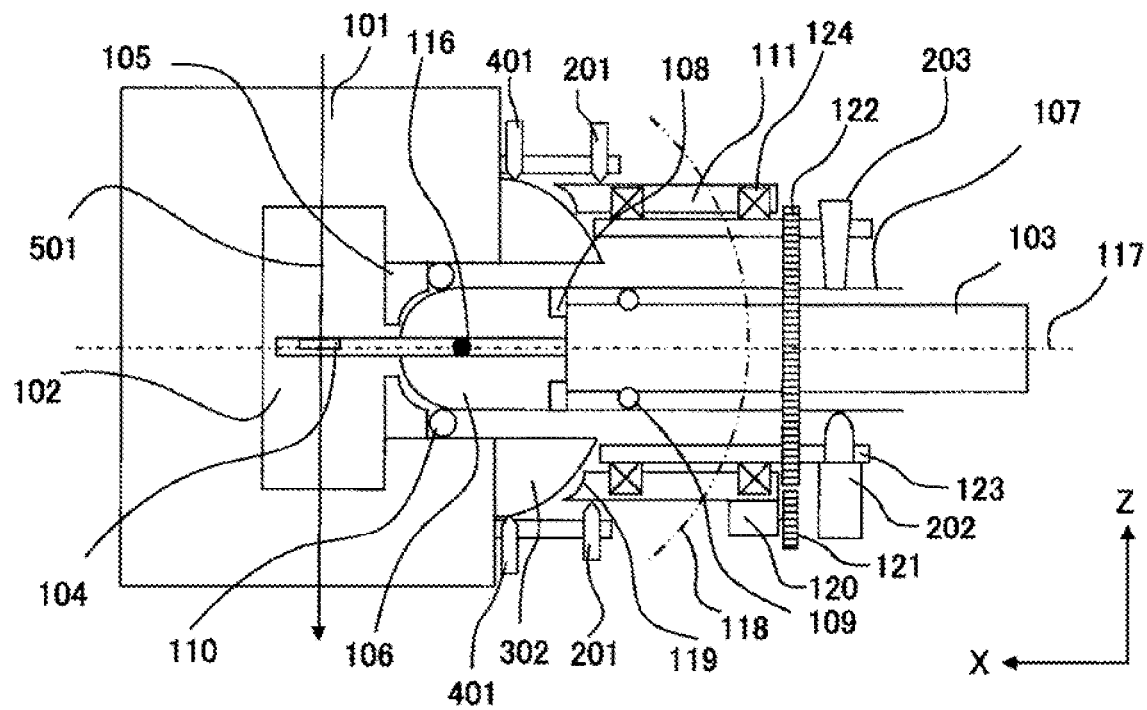
[FIG. 5]
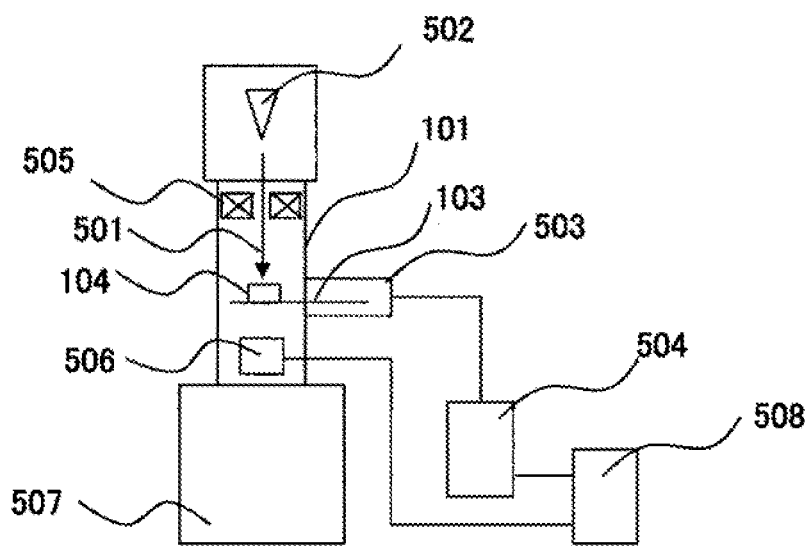

[FIG. 6]
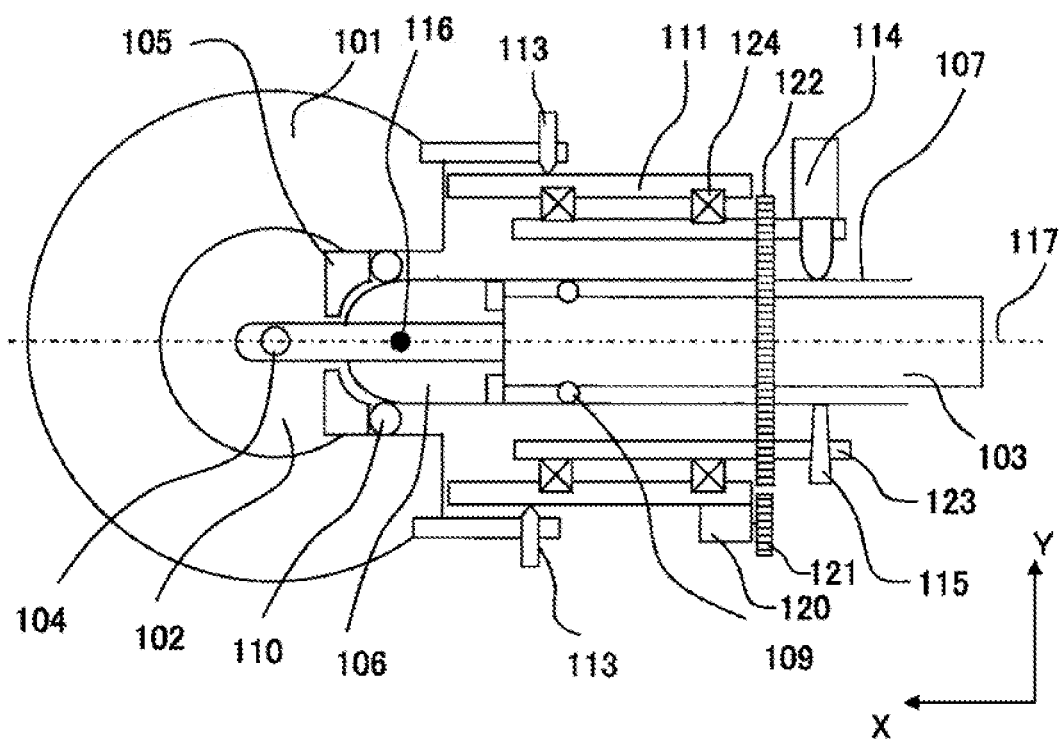

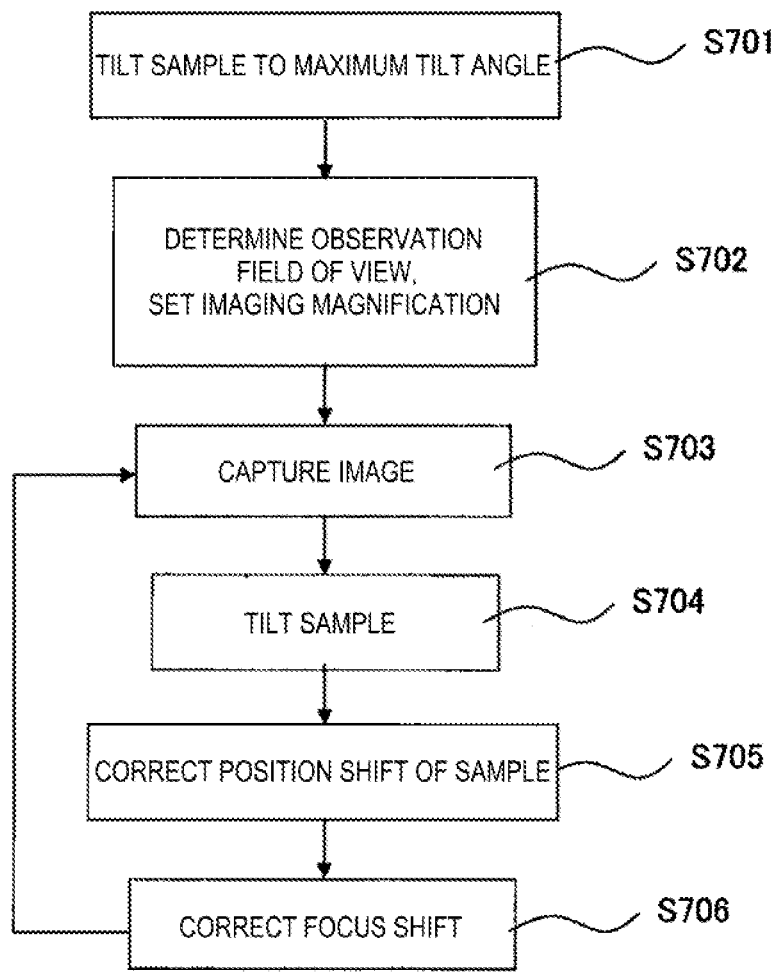
[FIG. 7]

ELECTRON MICROSCOPE

TECHNICAL FIELD

The present invention relates to an electron microscope.

BACKGROUND ART

In a sample moving mechanism of an electron microscope, particularly a transmission electron microscope (TEM), a side entry type mechanism is adopted. A sample is moved by a swinging motion around the center of a spherical surface. A holder for mounting the sample is mounted coaxially with a cylinder called a sample holder supported on a spherical base.

PTL 1 discloses a technique for adjusting a direction of a stage subjected to a eucentric adjustment, and making a rotation axis pass through a center of an electron microscope.

PTL 2 discloses a holder that reduces the amount of a sample observation part going out of the field of view when the sample holder is rotated about an axis thereof.

CITATION LIST

Patent Literature

PTL 1: JP-A-2001-312989
PTL 2: JP-A-2004-79313

SUMMARY OF INVENTION

Technical Problem

In a side entry type sample moving mechanism, it is difficult to perfectly match a center of a spherical fulcrum and an axis of the sample moving mechanism at any observation position. Therefore, when the sample is tilted, a field-of-view shift and a focus shift from the observation position occur, and in an automatic imaging function for continuous tilted images required for tomography using TEM images, it took time to correct the field-of-view shift and the focus shift when the sample is tilted.

Solution to Problem

An electron microscope of the invention includes a first spherical receiver fixed to a column of the electron microscope and configured to slide with a spherical fulcrum provided at a tip end of a sample holder; a spherical surface part provided on the column; and a second spherical receiver provided outside the column. The spherical surface part and the second spherical receiver slide on a contact part between the spherical surface part and the second spherical receiver, and a track of the slide is along a spherical surface centered on a central axis of the first spherical receiver, so that the above-described problem is solved.

Advantageous Effect

When continuous tilted images used for tomography are acquired, since the field-of-view shift and the focus shift from the observation position of the sample when the sample is tilted are reduced, it is possible to capture images at higher speed and higher magnification.

BRIEF DESCRIPTION OF DRAWINGS

FIG. 1 is a view showing a sample moving mechanism on a sample plane of a first embodiment of the invention.

FIG. 2 is a view showing the sample moving mechanism on a plane including an electron beam axis of the first embodiment of the invention.

FIG. 3 is a view showing a sample moving mechanism on a sample plane of a second embodiment of the invention.

FIG. 4 is a view showing the sample moving mechanism on a plane including the electron beam axis of the second embodiment of the invention.

FIG. 5 shows a schematic view of a transmission electron microscope (TEM).

FIG. 6 is a view showing a comparative example of the sample moving mechanism on a sample plane.

FIG. 7 is a diagram showing a flow of capturing continuously tilted images.

DESCRIPTION OF EMBODIMENTS

First Embodiment

First, a comparative example of the invention will be described with reference to FIGS. 5 and 6.

A schematic configuration of an electron microscope, particularly a transmission electron microscope (TEM) will be described with reference to FIG. 5. An electron beam 501 generated by an electron gun 502 is converged by using a lens 505 and is emitted to a sample 104 on a sample holder 103 mounted on a sample stage 503. Electrons transmitted through the sample are detected by a detector 506, and taken into and captured by a main control unit 508 to observe the sample 104. A column 101 is fixed to a base frame 507 from which vibration has been removed. The sample stage 503 receives a command from the main control unit 508 and is controlled by a controller for stage 504.

The comparative example of a sample moving mechanism on a sample plane will be described with reference to FIG. 6. The sample 104 is thinned to an order of several tens of nm by a focused ion beam device or the like, and then the thinned sample is attached to a metal mesh normally having a diameter of about 3 mm and mounted on the sample holder 103. The sample holder 103 is introduced to a sample chamber 102 through a sample holder outer cylinder 107. The sample chamber 102 is vacuum-sealed by a sample holder o-ring 109, a sample holder outer cylinder o-ring 110, or the like, and is evacuated to about $10^{-5}$ Pa using a vacuum pump.

A first spherical receiver 105 fixed to the column 101 is in contact with a spherical fulcrum 106. The sample holder outer cylinder 107 including the spherical fulcrum 106 swings around the center of the spherical fulcrum 106, and therefore the sample 104 can move in a Z direction (a direction perpendicular to a paper surface) and a Y direction (an upper-lower direction on the paper surface). In order to drive the sample in the Y direction, a Y direction driving mechanism 114 fixed to a rotation base 111 is operated. The Y direction driving mechanism 114 usually exerts a repulsive force by a Y direction push spring 115 located at an opposite position thereof, and keeps the sample holder outer cylinder 107 and the sample holder 103 stationary. Further, the sample holder 103 is driven to the Z direction by another linear mechanism that can be driven in a direction (Z direction) perpendicular to the paper surface (not shown).

In order to tilt the sample with respect to the electron beam, the sample 104, the sample holder 103, and the sample holder outer cylinder 107 can be rotated about a rotation axis of the rotation base 111 using the rotation base 111. A gear 121 rotates by a motor 120 provided on the rotation base 111, and the drive is transmitted to a gear 122 provided on a rotation cylinder 123, the rotation cylinder 123 rotates inside a bearing 124, and the sample holder 103 rotates about a rotation axis 117 together with the rotation cylinder 123.

If a sample observation position and the center of the spherical fulcrum are on the rotation axis 117, an observation position shift or a focus shift does not occur when the sample is tilted. A mechanism where the position shift and the focus shift do not occur even when the sample is tilted is generally referred to as a eucentric mechanism. The rotation base 111 includes Y direction position adjustment mechanisms 113 that adjust a position such that the rotation axis 117 of the sample holder 103 matches the center of the spherical fulcrum 106, and the adjustment is referred to as a eucentric adjustment.

Ideally, as shown in FIG. 6, it is possible to make the eucentric adjustment to make the sample observation position and the center of the spherical fulcrum on the rotation axis 117, but, actually, mechanical shift may occur on positions of the first spherical receiver 105 and the spherical fulcrum 106, so that it is difficult to adjust the center of the spherical fulcrum 106 and the observation position on the rotation axis 117.

A first embodiment of the invention is described with reference to FIGS. 1 and 2. The first spherical receiver 105 fixed to the column 101 is in contact with the spherical fulcrum 106. The sample holder outer cylinder 107 including the spherical fulcrum 106 swings around the center of the spherical fulcrum 106, and therefore the sample 104 can move in the Z direction (the direction perpendicular to paper surface) and the Y direction (the upper-lower direction on the paper surface). In order to drive the sample in the Y direction, the Y direction driving mechanism 114 fixed to the rotation cylinder 123 is operated. The Y direction driving mechanism 114 usually exerts the repulsive force by the Y direction push spring 115 located at the opposite position thereof, and keeps the sample holder outer cylinder 107 and the sample holder 103 stationary.

Further, when the sample is moved in the direction (Z direction) parallel to the electron beam, the motion can be implemented by a Z direction driving mechanism 202 fixed to the rotation cylinder 123 as shown in FIG. 2. Similarly to the Y direction driving mechanism 114, a Z direction push spring 203 is attached to a position opposite to the Z direction driving mechanism 202, and keeps the sample holder outer cylinder 107 and the sample holder 103 stationary.

In order to tilt the sample with respect to the electron beam, the sample 104, the sample holder 103, and the sample holder outer cylinder 107 can be rotated about a rotation axis using the rotation base 111. The gear 121 rotates by the motor 120 provided on the rotation base 111, and the drive is transmitted to the gear 122 provided on the rotation cylinder 123, the rotation cylinder 123 rotates inside the bearing 124, and the sample holder 103 rotates about the rotation axis 117 together with the rotation cylinder 123.

Further, a second spherical receiver 119 provided on the rotation base 111 can slide in the Y direction and the Z direction along a spherical surface part 112 that is provided on the column 101 and has a same spherical center position as the first spherical receiver 105 fixed to the column 101 since the rotation base 111 moves along a track 118 of the rotation base. The rotation base 111 can operate and move a pair of Y direction position adjustment mechanisms 113 in the Y direction. Further, the rotation base 111 can operate and move Z direction position adjustment mechanisms 201 shown in FIG. 2 in the Z direction.

With these mechanisms, the rotation axis 117 of the sample holder 103 always matches the spherical center of the spherical fulcrum 106. In this embodiment, the sample moving mechanism which includes the rotation base 111, the rotation cylinder 123, the sample holder outer cylinder 107, the sample holder 103, the adjustment mechanism and the like has been described as an example, but the sample moving mechanism may be provided in any configuration. An example in which the second spherical receiver 119 is provided on the rotation base 111 which is a part of the sample moving mechanism has been described, but the second spherical receiver 119 can be provided at any position of the sample moving mechanism.

In the eucentric adjustment, it is necessary for the observation position and the spherical center of the spherical fulcrum 106 to be on the rotation axis 117 of the sample holder 103. It is necessary for the rotation axis 117 to intersect with the electron beam 501. Further, it is necessary to set an intersection of the rotation axis 117 and the electron beam 501 at a focused position of the sample under a reference current of objective lens coils.

When the sample moving mechanism of the invention is used, since the rotation axis of the sample holder 103 always exists on the center of the spherical fulcrum 106, the rotation base 111 can be adjusted in any direction by operating the Y direction position adjustment mechanisms 113 and the Z direction position adjustment mechanisms 201 while maintaining a eucentric state.

Here, capturing of continuous tilted images using the TEM will be described with reference to FIG. 7. In S701, the sample is tilted to a maximum tilt angle, for example, a maximum tilt angle at a plus side, of tilt angles at which the continuous tilted images are captured. Then, in S702, an operator of the TEM determines an imaging field-of-view, sets an imaging magnification, and the like, and captures an image in step S703. Thereafter, in S704, the sample is tilted by about several degrees. When the sample is tilted, the sample may shift from the observation position due to a limit of mechanical rotation accuracy of the sample stage, or a shift from complete eucentric. In S705, the amount of shift is calculated by using an image processing technique, and is corrected by being fed back to a deflection lens mounted on the sample moving mechanism or the TEM. For a similar reason, since the focus shift of the sample occurs, in S706, the amount of focus shift is calculated, and the focus shift is corrected by being fed back to the objective lens coils mounted on the sample stage or the TEM. Typically, these series of operations are automatically executed by software installed in a main controller of the TEM.

While the sample is tilted in several steps, position shift correction and focus shift correction are repeated, images are captured, and the capturing of the continuous tilt images ends when the sample reaches the maximum tilt angle at the minus side.

When the sample moving mechanism of the invention is used, it is possible to reduce the position shift and the focus shift when the sample is tilted, so that it is possible to minimize the amounts of shift correction and to capture the continuous tilted images at high speed and high magnification.

Second Embodiment

A second embodiment of the invention will be described with reference to FIGS. 3 and 4. In the first embodiment, the spherical surface part 112 and the column 101 are formed of the same member, but these members also can be separated to form a movable spherical surface part 302. The movable spherical surface part 302 can be adjusted in the Y direction and the Z direction respectively by a Y direction position adjustment mechanism for a movable spherical surface part 301 shown in FIG. 3 and a Z direction position adjustment mechanism for a movable spherical surface part 401 shown in FIG. 4. Since positional accuracy of the center of the spherical surface part 112 and the center of the spherical fulcrum 106 is determined by the accuracy of machining, there may be a shift of about several μm, but since the spherical surface part 112 is movable, the center of the movable spherical surface part 302 can match the center of the spherical fulcrum 106 more precisely.

The second spherical receiver 119 provided on the rotation base 111 can slide in the Y direction and the Z direction along the movable spherical surface part 302 that is provided on the column 101 and has a same spherical center position as the first spherical receiver 105 fixed to the column 101 since the rotation base 111 moves along the track 118 of the rotation base. The rotation base 111 can operate and move the pair of Y direction position adjustment mechanisms 113 in the Y direction. Further, the rotation base 111 can operate and move the Z direction position adjustment mechanisms 201 shown in FIG. 4 in the Z direction. With these mechanisms, the rotation axis 117 of the sample holder 103 always matches the spherical center of the spherical fulcrum 106. Further, by making the position of the movable spherical surface part 302 adjustable, even if vibration or thermal position shift occurs, the center of the movable spherical surface part 302 can match the center of the spherical fulcrum 106 more precisely.

REFERENCE SIGN LIST

101: column
102: sample chamber
103: sample holder
104: sample
105: first spherical receiver
106: spherical fulcrum
107: sample holder outer cylinder
108: sample holder support portion
109: sample holder o-ring
110: sample holder outer cylinder o-ring
111: rotation base
112: spherical surface part
113: Y direction position adjustment mechanism
114: Y direction driving mechanism
115: Y direction push spring
116: center of spherical fulcrum
117: rotation axis
118: track of rotation base
119: second spherical receiver
120: motor
121: gear
122: gear
123: rotation cylinder
124: bearing
201: Z direction position adjustment mechanism
202: Z direction driving mechanism
203: Z direction push spring
301: Y direction position adjustment mechanism for movable spherical surface part
302: movable spherical surface part
401: Z direction position adjustment mechanism for movable spherical surface part
501: electron beam
502: electron gun
503: sample stage
504: controller for stage
505: lens
506: detector
507: base frame
508: main control unit

The invention claimed is:

1. An electron microscope including a side entry stage, the electron microscope comprising:
 a column;
 a sample holder on which a sample is mounted;
 a first spherical receiver fixed to the column and configured to slide with a spherical fulcrum provided at a tip end of the sample holder;
 a spherical surface part provided on the column; and
 a second spherical receiver provided outside the column, wherein
 the spherical surface part and the second spherical receiver slide on a contact part between the spherical surface part and the second spherical receiver, and a track of the slide is along a spherical surface centered on a central axis of the first spherical receiver.

2. The electron microscope according to claim 1, wherein the spherical surface part is movable and includes a position adjustment mechanism configured to adjust a position of the spherical surface part.

* * * * *